United States Patent
Amato

(10) Patent No.: US 7,868,629 B2
(45) Date of Patent: Jan. 11, 2011

(54) PROPORTIONAL VARIABLE RESISTOR STRUCTURES TO ELECTRICALLY MEASURE MASK MISALIGNMENT

(75) Inventor: Joseph M Amato, Rochester, NY (US)

(73) Assignee: NXP B.V., Eindhoven (NL)

( * ) Notice: Subject to any disclaimer, the term of this patent is extended or adjusted under 35 U.S.C. 154(b) by 429 days.

(21) Appl. No.: 10/587,442

(22) PCT Filed: Aug. 26, 2004

(86) PCT No.: PCT/IB2004/051568
§ 371 (c)(1),
(2), (4) Date: Aug. 15, 2007

(87) PCT Pub. No.: WO2005/019938
PCT Pub. Date: Mar. 3, 2005

(65) Prior Publication Data
US 2008/0197862 A1   Aug. 21, 2008

Related U.S. Application Data

(60) Provisional application No. 60/497,960, filed on Aug. 26, 2003.

(51) Int. Cl.
G01R 27/08     (2006.01)
G01D 21/00     (2006.01)

(52) U.S. Cl. ............................ 324/693; 324/695; 33/645
(58) Field of Classification Search ................. 324/693, 324/695, 696, 701; 33/645
See application file for complete search history.

(56) References Cited

U.S. PATENT DOCUMENTS

| | | | | |
|---|---|---|---|---|
| 3,808,527 A | * | 4/1974 | Thomas | 324/716 |
| 4,153,998 A | * | 5/1979 | McMurtry | 33/556 |
| 4,386,459 A | * | 6/1983 | Boulin | 438/11 |
| 4,437,760 A | * | 3/1984 | Ausschnitt | 355/133 |
| 4,571,538 A | * | 2/1986 | Chow | 324/716 |
| 6,393,714 B1 | * | 5/2002 | Look et al. | 33/645 |

* cited by examiner

*Primary Examiner*—Timothy J Dole
*Assistant Examiner*—Farhana Hoque

(57) ABSTRACT

A system, method and structures employing proportional variable resistors suitable for electrically measuring unidirectional misalignment of stitched masks in etched interconnect layers. In an example embodiment, there is a structure (10, 20) that comprises at least one proportional variable resistor (24) suitable for electrically measuring unidirectional misalignment of stitched masks in etched interconnect layers. The structure (10,20) comprises at least a first mask (10) and a second mask (20) that when superimposed comprise at least two test pads (14, 16) and interconnects (12, 22) the resistance between (24) which can be measured.

19 Claims, 6 Drawing Sheets

PROPORTIONAL VARIABLE RESISTOR STRUCTURES TO ELECTRICALLY MEASURE MASK MISALIGNMENT

CROSS REFERENCE TO RELATED APPLICATION

This application claims the benefit of U.S. Provisional Application Ser. No. 60/497,960 filed Aug. 26, 2003, which is incorporated herein whole by reference.

This invention relates to the measurement of stitching offsets in etched interconnect layers, and more particularly, to structures, systems and methods employing proportional variable resistors suitable for electrically measuring unidirectional misalignment of stitched masks in etched interconnect layers.

One step in the production of a microdevice is photolithography in which contacts are patterned in a mask, on top of glass and the contacts are etched. After removal of the mask the patterned wafer is covered with a thin layer of aluminum. Applying lithography again, spaces between the aluminum lines are etched away, the mask is removed and a new layer is deposited. The glass layer is polished and the process is repeated until all layers of interconnect have been applied. The whole process hinges on the use of the photographic process to create the fine-featured patterns of the integrated circuit. A specific mask defines each layer of the chip and there are typically up to 24 mask layers in each IC.

As exposure areas have become increasingly large in keeping with the increased size of substrates, block exposure type stitching processes which partition the exposure area of the substrate into a plurality of unit areas (sometimes referred to as "shots" or "shot areas") and successively project and expose images of corresponding patterns on the shots have been developed. Such stitching of masks can result in misalignments which must be avoided since defects in masks can cause short circuits, open circuits or other design rule violations, any of which can be fatal to the functionality of the chip.

Therefore inspection and measurement of stitched masks is essential. Currently, the only known method of inspection is visual inspection employing devices such as scanning electron microscopes to detect misalignments. As fine geometries become smaller the ability to observe defects visually becomes more expensive and difficult.

Accordingly a need exists in the art for a method and/or device suitable for electrically measuring unidirectional misalignment of stitched masks in etched interconnect layers.

In accordance with the invention, offset detection is isolated to one direction and mask misalignment is used as the variable resistor. In one embodiment the structure has a decreased resistance compared to that of its control structure when a positive offset on the secondary mask of a stitched mask set occurs. In another embodiment the structure has an increased resistance compared to that of its control structure when a positive offset on the secondary mask of a stitched mask set occurs.

Figure 1:
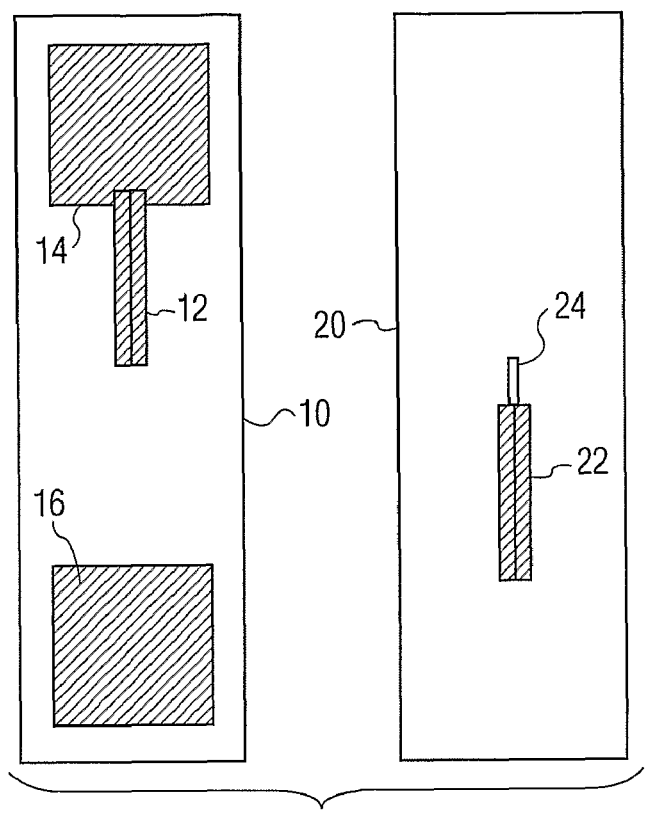
FIG. 1 is a top plan view of masks according to the present invention.
Figure 2:
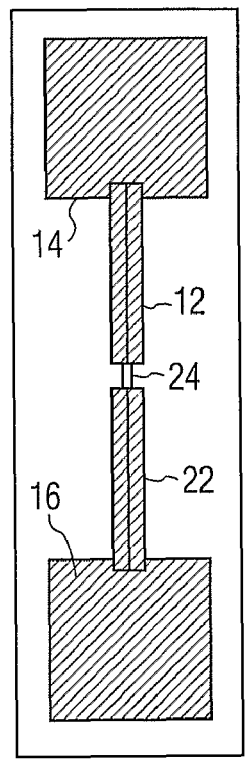
FIG. 2 is a top plan view of the masks of FIG. 1 superimposed.
Figure 3:
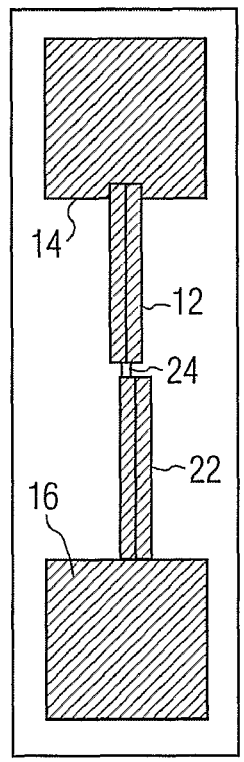
FIG. 3 is a top plan view of the masks of FIG. 1 superimposed and misaligned.
Figure 4:
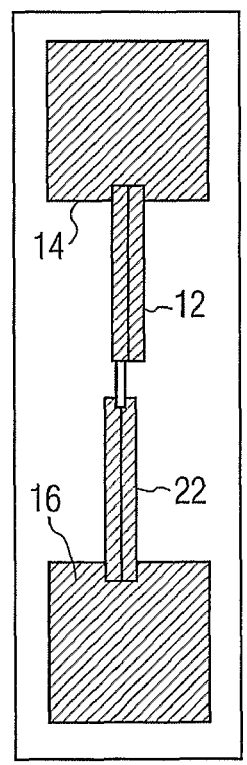
FIG. 4 is a top plan view of the masks of FIG. 1 superimposed and misaligned.

Now referring to FIG. 1 in a preferred embodiment a first reference mask 10 is provided comprising interconnect 12 and test pads 14 and 16. A second mask 20 is further provided, said second mask 20 comprising interconnect 22 and contact 24. In practice second mask 20 is superimposed on reference mask 10 to complete a resistor between test pads 14 and 16. Now referring to FIG. 2 proper alignment of mask 10 and mask 20 produces the desired optimum structure shown in which interconnects 12 and 22 are vertically aligned. A resistance measurement is made by contacting test pads 14 and 16 with a suitable probe as known to those skilled in the art to establish the reference resistance of the optimum structure across contact 24. Now referring to FIG. 3 if mask 20 is misaligned such that there is a smaller distance between interconnects 12 and 22 the resistance between the test pads 14 and 16 will decrease proportionally to the vertical offset. This is due to the fact that the resistance of an interconnect is proportional to the distance 24. Now referring to FIG. 4, similarly, if the mask misalignment occurs such that there is a greater distance between interconnects 12 and 22, the resistance will increase proportionally. The geometry of the structure isolates the offset direction; i.e., horizontal offsets are not measured by what is shown in FIGS. 4 and 5.

Figure 5:
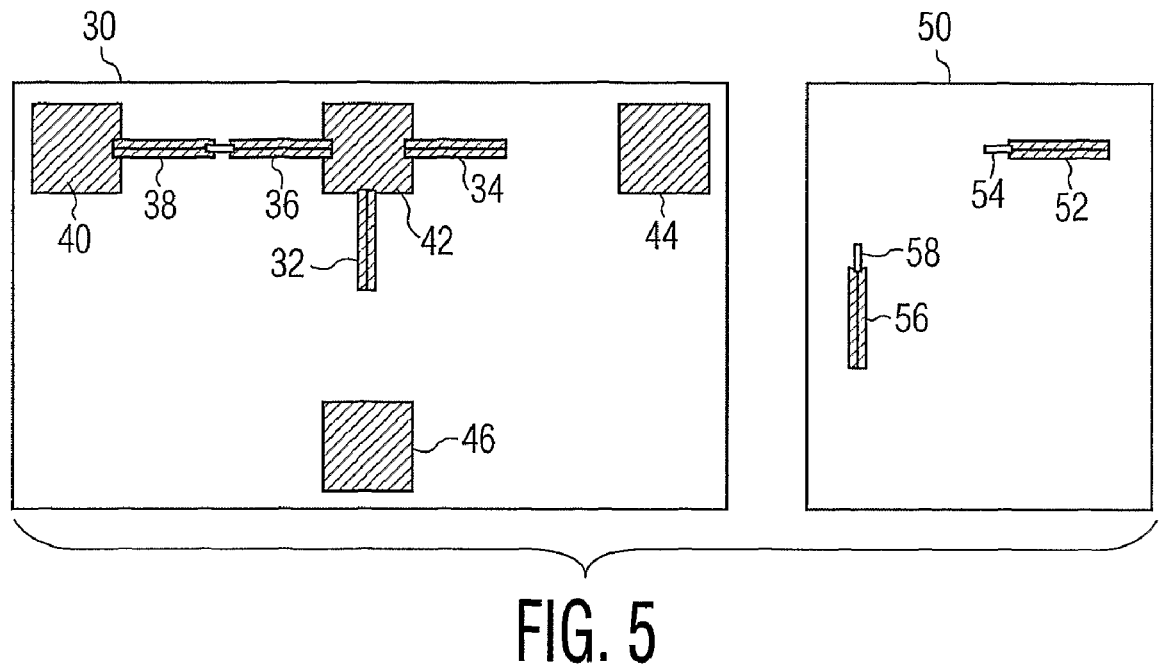
FIG. 5 is a top plan view of masks according to a preferred embodiment of the present invention.

Now referring to FIG. 5 in another preferred embodiment a reference mask 30 is provided comprising "stick" type interconnects 32, 34, 36 and 38 and test pads 40, 42, 44 and 46. A second mask 50 is further provided, said second mask 50 comprising interconnect 52 and contact 54 and interconnect 56 and contact 58. In practice second mask 50 is superimposed on reference mask 30 to complete resistors between test pads 42 and 44 and between test pads 42 and 46. Now referring to FIG. 6 proper alignment of mask 50 and mask 30 produces the desired optimum structure shown in which interconnects 34 and 52 are vertically aligned and interconnects 32 and 56 are vertically aligned. A resistance measurement is made by contacting test pads 42, 44 and 46 with a suitable probe as known to those skilled in the art to establish the reference resistance of the optimum structure across contacts 54 and 58.

Figure 6:
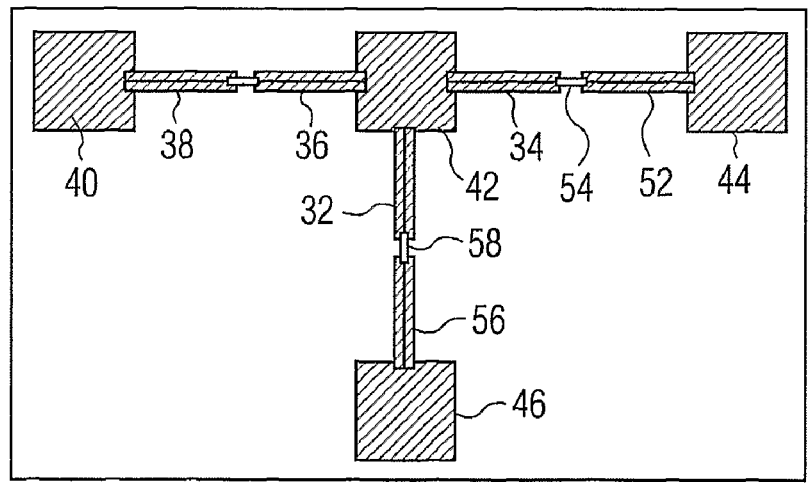
FIG. 6 is a top plan view of the masks of FIG. 5 superimposed.
Figure 7:
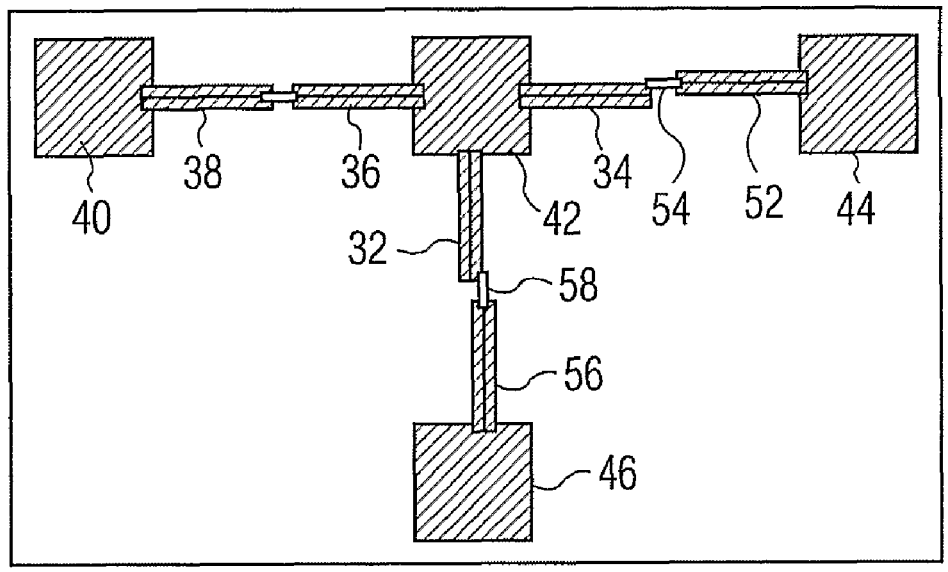
FIG. 7 is a top plan view of the masks of FIG. 5 superimposed and misaligned.
Figure 8:
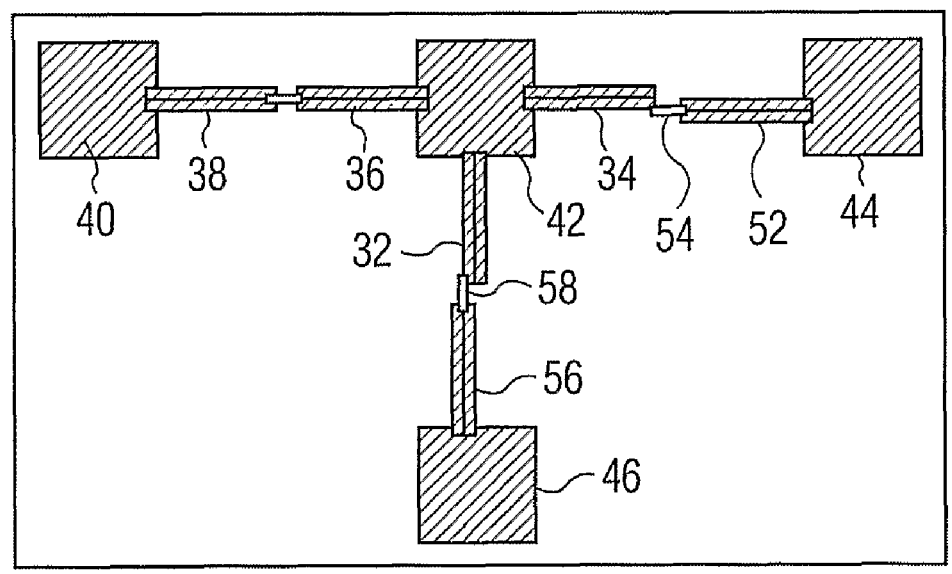
FIG. 8 is a top plan view of the masks of FIG. 5 superimposed and misaligned.

Now referring to FIG. 7 mask 50 of FIG. 5 is misaligned in that it is oriented upward and to the right of its optimum location as seen in FIG. 6. This mismatch results in a smaller distance between interconnects 32 and 56, therefore the resistance between the test pads 42 and 46 will decrease proportionally to the vertical offset. The mismatch also results in a larger distance between interconnects 34 and 52, therefore the resistance between pads 42 and 44 will increase proportionally. Now referring to FIG. 8, if mask 50 is misaligned down and to the right of its optimum position there is a greater distance between interconnects 32 and 56, therefore the resistance will increase proportionally. In this example the distance between interconnects 34 and 52 is decreased; therefore the resistance will decrease proportionally.

Note that each direction is measured by one set of test pads, and the measurement directions are independent. Thus, horizontal misalignment is measured by interconnects 34, 36, 38 and 52 of FIG. 7, while vertical misalignment is measured by interconnects 32 and 56.

Figure 9:
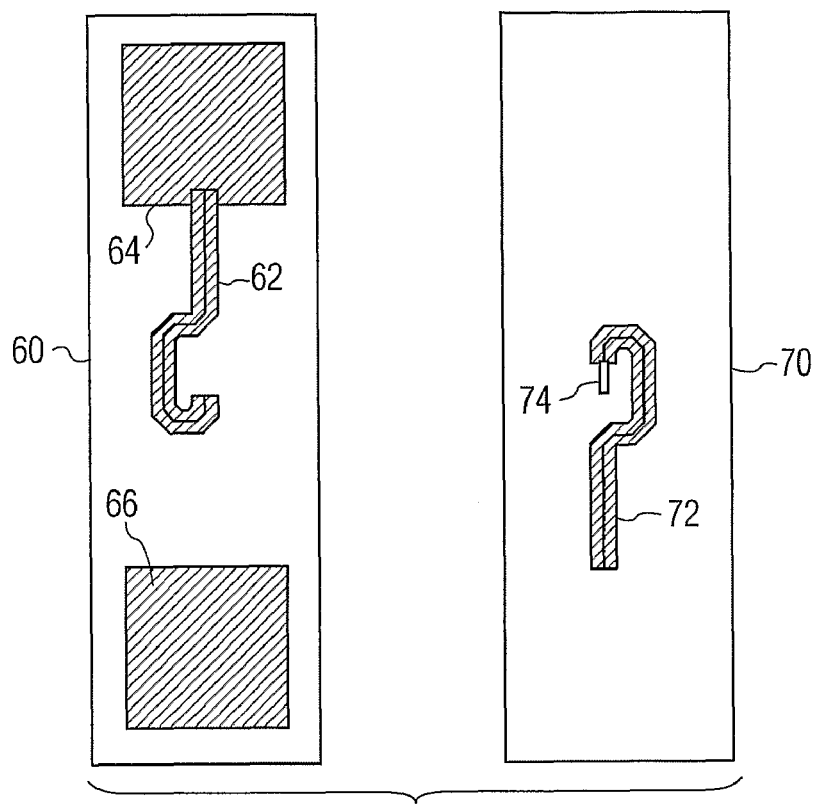
FIG. 9 is a top plan view of masks according to a most preferred embodiment of the present invention.
Figure 10:
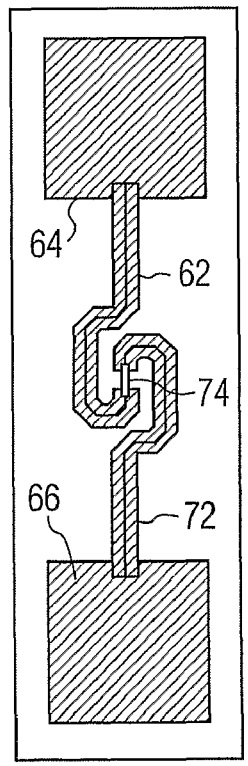
FIG. 10 is a top plan view of the masks of FIG. 9 superimposed.
Figure 11:
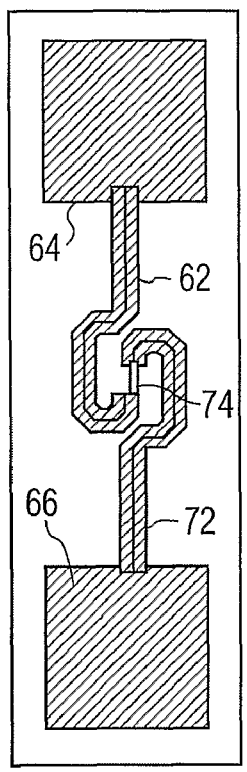
FIG. 11 is a top plan view of the masks of FIG. 9 superimposed and misaligned.
Figure 12:
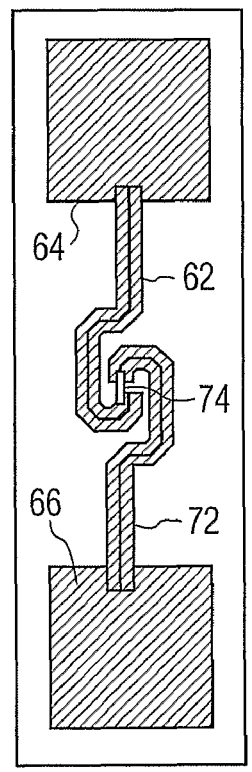
FIG. 12 is a top plan view of the masks of FIG. 9 superimposed and misaligned.

Now referring to FIG. 9 in a most preferred embodiment a first reference mask 60 is provided comprising "hook" type interconnect 62 and test pads 64 and 66. A second mask 70 is further provided, said second mask 70 comprising interconnect 72 and contact 74. In practice second mask 70 is superimposed on reference mask 60 to complete a resistor between test pads 64 and 66. Now referring to FIG. 10 proper alignment of masks 60 and 70 produces the desired optimum structure shown in which interconnects 62 and 72 are vertically aligned. A resistance measurement is made by contacting test pads 64 and 66 with a suitable probe as known to those skilled in the art to establish the reference resistance of the optimum structure across contact 74. Now referring to FIG. 11 if mask 70 is misaligned, in this case, wherein the interconnects are aligned closer than they should be, there is an inversely proportional increase in resistance because there is a greater distance between interconnects 62 and 72 across contact 74. Now referring to FIG. 12, similarly, if the masks are misaligned such that the interconnects 62 and 72 are moved further away from each other than optimum, there is a smaller distance between interconnects 62 and 72 across contact 74, therefore the resistance will decrease inversely to the direction in which the interconnects are misaligned.

In this manner mask mismatches may be measured simply by applying a probe to a test pad to measure the resistance between test pads. A method is thus provided for measuring stitched mask misalignment in etched interconnect layers by providing a reference mask having test pads disposed thereon and superimposing on said reference mask a second mask to provide proportional variable resistors between complementary test pads and interconnects of the respective masks, measuring the resistance of the proportional variable resistors, establishing an optimum resistance between interconnects, comparing the measured resistance to said optimum resistance and adjusting the position of said masks to alignment. When the resistance matches the reference resistance the masks are aligned.

While the above describes the preferred embodiment of the invention, various modifications or additions would be apparent to those of skill in the art. For example, the shapes of the interconnects are not limited to those set forth in the Figures. In addition the layout of the masks set forth herein are exemplary and the teachings of the present invention are applicable to any layout contemplated and not limited to what is shown in the Figures.

What is claimed is:

1. A structure comprising:
   at least one proportional variable resistor suitable for electrically measuring unidirectional misalignment of stitched masks in etched interconnect layers, said variable resistor comprising:
      at least a first mask and a second mask that when superimposed comprise:
         at least two test pads, wherein the two test pads are both formed by the first mask;
         two interconnects between the test pads; and
         a contact having a smaller width than widths of the interconnects, wherein the width of the contact is a dimension substantially orthogonal to a direction of signal propagation along the contact, and the widths of the interconnects are dimensions substantially orthogonal to directions of signal propagation along the interconnects, wherein the contact is formed by the same mask as at least one of the interconnects, wherein a resistance between the test pads is dependent on a distance along the contact between the interconnects, and the resistance is indicative of the misalignment of the first and second masks.

2. The structure according to claim 1 wherein the variable resistor comprises a directly proportional variable resistor which exhibits an increased resistance based on a greater distance along the contact between the interconnects due to a greater overlap of one of the interconnects with an adjacent test pad.

3. The structure according to claim 1 wherein the variable resistor comprises an inversely proportional variable resistor which exhibits a decreased resistance based on a shorter distance along the contact between the interconnects due to a greater overlap of one of the interconnects with an adjacent test pad.

4. The structure according to claim 1 wherein the interconnects comprise at least one stick type interconnect of a substantially rectangular geometry.

5. The structure according to claim 1 wherein the interconnects comprise at least one hook type interconnect, wherein the hook type interconnect comprises:
   an intermediate portion which is non-linear within a plane of the corresponding mask; and
   two ends separated by the intermediate portion, wherein both of the ends extend from the intermediate portion in substantially the same direction.

6. The structure according to claim 1, wherein the variable resistor is formed by at most two layers comprising the first and second masks.

7. The structure according to claim 1, wherein the contact extends laterally away from the interconnect of the mask with which the contact is formed.

8. A system for electrically measuring unidirectional misalignment of stitched masks in etched interconnect layers, said system comprising:
   at least one proportional variable resistor comprising:
      a reference mask comprising at least two test pads and at least one interconnect; and
      a second mask comprising at least one interconnect and a contact, wherein the contact has a smaller width than widths of the interconnects, wherein the width of the contact is a dimension substantially orthogonal to a direction of signal propagation along the contact, and the widths of the interconnects are dimensions substantially orthogonal to directions of signal propagation along the interconnects, wherein a resistance between the test pads is dependent on a distance along the contact between the interconnects; and
   a probe for testing the resistance between the test pads along said interconnect of said reference mask and said interconnect and said contact of said second mask when said masks are superimposed.

9. The system according to claim 8, the at least one interconnect of said reference mask comprising at least one stick type interconnect of a substantially rectangular geometry.

10. The system according to claim 8, the at least one interconnect of said reference mask comprising at least one hook type interconnect, wherein the hook type interconnect comprises:
    an intermediate portion which is non-linear within a plane of the corresponding mask; and two ends separated by the intermediate portion, wherein both of the ends extend from the intermediate portion in substantially the same direction.

11. The system according to claim 8, the at least one interconnect of said second mask comprising at least one stick type interconnect of a substantially rectangular geometry.

12. The system according to claim 8, the at least one interconnect of said second mask comprising at least one hook type interconnect, wherein the hook type interconnect comprises:
   an intermediate portion which is non-linear within a plane of the corresponding mask; and
   two ends separated by the intermediate portion, wherein both of the ends extend from the intermediate portion in substantially the same direction.

13. The system according to claim 8, wherein the variable resistor comprises an inversely proportional variable resistor which exhibits a decreased resistance based on a shorter distance along the contact between the interconnects due to a greater overlap of one of the interconnects with an adjacent test pad.

14. The system according to claim 8, wherein the variable resistor comprises a directly proportional variable resistor which exhibits an increased resistance based on a greater distance along the contact between the interconnects due to a greater overlap of one of the interconnects with an adjacent test pad.

15. The system according to claim 8, wherein the contact extends laterally away from the interconnect of the second mask.

16. A method of measuring stitched mask misalignment in etched interconnect layers, the method comprising:
   providing a reference mask comprising at least two test pads and at least one interconnect;
   providing a second mask comprising at least one interconnect and a contact, wherein the contact has a smaller width than widths of the interconnect on the second mask, wherein the width of the contact is a dimension substantially orthogonal to a direction of signal propagation along the contact, and the widths of the interconnects are dimensions substantially orthogonal to directions of signal propagation along the interconnects;
   superimposing said reference mask and said second mask to provide at least one proportional variable resistor between the test pads over the interconnect of the reference mask and the interconnect and the contact of the second mask, wherein the resistance between the test pads is dependent on a distance along the contact between the interconnect of the reference mask and the interconnect of the second mask; and
   electrically measuring the resistance of said at least one proportional variable resistor.

17. The method according to claim 16 further comprising establishing an optimum resistance between said test pads, wherein the optimum resistance corresponds to a configuration in which the reference mask and the second mask are aligned.

18. The method according to claim 17 further comprising:
   comparing the measured resistance to said optimum resistance; and
   adjusting the position of said masks to alignment.

19. The structure method according to claim 16, wherein the contact extends laterally away from the interconnect of the reference mask.

* * * * *